(12) United States Patent
Yen et al.

(10) Patent No.: US 11,489,521 B2
(45) Date of Patent: Nov. 1, 2022

(54) POWER TRANSISTOR MODULE AND CONTROLLING METHOD THEREOF

(71) Applicant: Fast SiC Semiconductor Incorporated, Hsinchu (TW)

(72) Inventors: Cheng-Tyng Yen, Hsinchu (TW); Fu-Jen Hsu, Hsinchu (TW); Hsiang-Ting Hung, Hsinchu (TW)

(73) Assignee: FAST SIC SEMICONDUCTOR INCORPORATED, Hsinchu (TW)

( * ) Notice: Subject to any disclaimer, the term of this patent is extended or adjusted under 35 U.S.C. 154(b) by 0 days.

(21) Appl. No.: 17/398,034

(22) Filed: Aug. 10, 2021

(65) Prior Publication Data

US 2021/0367593 A1 Nov. 25, 2021

Related U.S. Application Data

(63) Continuation-in-part of application No. 17/151,737, filed on Jan. 19, 2021, now Pat. No. 11,901,181.

(60) Provisional application No. 63/093,797, filed on Oct. 20, 2020, provisional application No. 62/963,187, filed on Jan. 20, 2020.

(51) Int. Cl.

| *H03K 3/00* | (2006.01) |
|---|---|
| *H03K 17/082* | (2006.01) |
| *H03K 17/687* | (2006.01) |
| *H03K 17/567* | (2006.01) |
| *H03K 17/60* | (2006.01) |
| *H03K 17/16* | (2006.01) |

(52) U.S. Cl.
CPC ......... *H03K 17/60* (2013.01); *H03K 17/0826* (2013.01); *H03K 17/165* (2013.01); *H03K 17/567* (2013.01)

(58) Field of Classification Search
None
See application file for complete search history.

(56) References Cited

U.S. PATENT DOCUMENTS

| 6,459,324 | B1 | 10/2002 | Neacsu et al. | |
|---|---|---|---|---|
| 6,784,721 | B2 | 8/2004 | Torrisi et al. | |
| 6,917,227 | B1 | 7/2005 | Ochi | |
| 7,242,238 | B2 * | 7/2007 | Higashi | H03K 17/0828 327/427 |
| 7,554,305 | B2 | 6/2009 | Nunokawa | |
| 7,705,673 | B2 | 4/2010 | Teng | |

(Continued)

OTHER PUBLICATIONS

TW Office Action dated Sep. 2, 2021 in Taiwan application No. 110101984.

*Primary Examiner* — Kenneth B Wells
(74) *Attorney, Agent, or Firm* — McClure, Qualey & Rodack, LLP

(57) ABSTRACT

A power transistor module includes a power transistor device and a control circuit. The control circuit is electrically connected to the power transistor device for providing at least one gate voltage to drive the power transistor device, and adjusting the at least one gate voltage in response to an output power of the power transistor module. When the output power is greater than a predetermined power load, the at least one gate voltage has a first swing amplitude; and when the output power is less than or equal to the predetermined power load the at least one gate voltage has a second swing amplitude less than the first swing amplitude.

23 Claims, 11 Drawing Sheets

(56) References Cited

U.S. PATENT DOCUMENTS 9,438,228 B2 9/2016 Peng et al.
2014/0300413 A1 10/2014 Hoyerby et al.

\* cited by examiner

POWER TRANSISTOR MODULE AND CONTROLLING METHOD THEREOF

This application is a continuation-in-part (CIP) application of U.S. application Ser. No. 17/151,737, filed on Jan. 19, 2021 (U.S. Pat. No. 11,190,181 issued on Nov. 30, 2021), which claims the benefit of U.S. provisional application Ser. No. 62/963,187, filed Jan. 20, 2020, and U.S. provisional application Ser. No. 63/093,797, filed Oct. 20, 2020, the subject matters of which are incorporated herein by references.

BACKGROUND

Technical Field

The disclosure relates in general to a power electronic module and a controlling method thereof, and more particularly to a power transistor module and the controlling method thereof.

Description of the Related Art

The power system of various electronic devices must undergo several power conversions, such as direct current/alternating current conversion (AC/DC) or direct current/direct current conversion (DC/DC), during the utilization and transmission of electric power. With the increasing demand in electric power and the requirements of saving energy, the power electronic devices which help to reduce power loss during power conversions become more and more important. Power transistors, such as metal-oxide-semiconductor field effect transistors (MOSFET), insulated gate bipolar transistors (IGBT), junction field effect transistors (JFET), high electron mobility transistors (HEMT), heterostructure field effect transistors (HFET) or modulation-doped field effect transistors (MODFET) etc., are unipolar and voltage controlled devices, having advantages of high input impedance, lower drive loss, lower on-resistance, lower switching loss, faster switching speed, and larger safe operating area, are now the most commonly used power devices in power conversion systems.

In general operation, a higher gate voltage (Vgs) may increase the current density of a power transistor device during the on-state and reduce its conduction loss. However, applying a higher gate voltage or high current density to the power transistor may induce brakeage of chemical bonds at the interface between the gate electrode and the gate dielectric and result in interface defects such as dangling bonds and fixed charges, which may cause the drift of electric characteristics. In addition to that, a higher gate voltage also increases the electrical field exerted a gate dielectric layer, which adversely impacts the lifetime and of the gate dielectric layer because the lifetime of the gate dielectric layer is inversely proportional to the applied electrical field.

Silicon carbide (SiC) is a wide band gap semiconductor material, which has a dielectric breakdown strength (the maximum electric field that the material can withstand) higher than silicon (Si). Power transistor devices made of SiC, such as SiC MOSFET and SiC IGBT, can provide lower conduction loss and switching loss than Si MOSFET or Si IGBT, thereby improving the efficiency of the power electronic systems applying the same and reducing energy consumption. Compared with traditional Si MOSFETs or Si IGBTs, SiC MOSFETs or SiC IGBTs have lower channel mobility and a higher ratio of channel resistance to the total on-resistance of the device. In addition, the on-resistance of the SiC MOSFETs or SiC IGBTs usually decreases with increasing gate voltage, due to their higher saturated electron drift velocity.

One of most common power transistors are n-channel enhancement mode MOSFETs, which use electrons (n-type) as the conducting carriers and are normally-off devices, meaning when the applied gate voltage is equal to or lower than zero volt (Vgs=0V or Vgs<0), the device is turned-off; and when the applied gate voltage is higher than the threshold voltage (Vth) (Vgs>Vth), the device is turned on and the conducting current starts to flow between the drain and the source. Taking SiC MOSFET with a 50 nm gate oxide thickness as an example, the threshold voltage (Vth) is usually designed to be 2~3V. When a gate voltage of 20V is applied to turn it on (at this time, the electric field applied to the gate dielectric layer (oxide layer) is about 4 MV/cm), the on-resistance of the SiC MOSFET can be reduced by about 10% compared to when a gate voltage of 18V is applied, and can be reduced by about 20% when a gate voltage of 16V is applied. In contrast, the on-resistance of typical Si power MOSFETs may saturate (reaches minimum) that have similar threshold voltage Vth may reach saturation between 8V to 10V. The on-resistance cannot be further reduced, when a higher gate voltage, such as 15V or 20V, is applied.

In addition to the on-resistance, the gate voltage affects turn-on and turn-off switching time and switching loss. For example, in ST Microelectronics' application note AN4671 "How to fine tune your SiC MOSFET gate driver to minimize loss" mentioned that the turn-off switching loss (Eoff) can be reduced by 35% to 40% when the turn-off gate voltage moves from 0V to −5V. In On-Semi's application note AND90103/D "ON Semiconductor Gen 1 1200V SiC MOSFETS & Modules: Characteristics and Driving Recommendations", also mentioned that the turn-on switching loss (Eon) can be reduced by 30% if Vgs=20V is used to turn on compared to Vgs=15V and the turn-off switching loss (Eoff) can be reduced by almost 50% if Vgs=−5V is used to turn off compared to Vgs=0V. The switching losses are the power losses due to the overlap of voltage (Vds, drain-to-source voltage in MOSFET) across the device and current (Id, drain current in MOSFET) through the device. Therefore, for any given Vgs used to turn on or turn off the device, the switching losses (Eon or Eoff) also increase with increasing Id or Vds.

Accordingly, when using a wide band-gap semiconductor power transistor, such as SiC MOSFET, there is a trade-off between lifetime and performance. On one hand, although higher performance (lower on-resistance) can be achieved by using a higher gate voltage to turn on the SiC MOSFET, the lifetime of the gate dielectric layer of the SiC MOSFET will be shorter because of the higher applied electric field. On the other hand, when a lower gate voltage is used to turn on the SiC MOSFET, although a lower applied electric field improves the lifetime of the gate dielectric layer, the performance of the SiC MOSFET (higher on-resistance) would have to be partially sacrificed. Of course people can still increase the active area to obtain a low on-resistance even with a lower gate voltage, however, SiC is an expensive material and increasing the chip area would mean increasing the cost. Furthermore, the dynamic characteristics of SiC MOSFETs, such as the input capacitance (Ciss), the output capacitance (Coss) and output charge (Qoss) will also increase with increasing chip area, which will result in a higher switching loss and reduce the efficiency.

Therefore, there is a need for providing a power transistor module and a controlling method thereof to overcome the drawbacks of the prior art.

SUMMARY

One aspect of the present disclosure provides a power transistor module, wherein the power transistor module includes a power transistor device and a control circuit electrically connected to the power transistor device. The control circuit provides at least one gate voltage to drive the power transistor device, and adjusts the gate voltage in response to at least one signal provided from an external device or fed back from the power transistor device; wherein the gate voltage is greater or lower than a threshold voltage of the power transistor device, and a swing amplitude of the gate voltage is a monotonically increasing or decreasing function of the signal.

Another aspect of the present disclosure provides a controlling method of a power transistor module, wherein the power transistor module includes a power transistor device, and the controlling method includes steps as follows: First, a control circuit is provided to electrically connect the power transistor device. Then, the control circuit is used to adjust at least one gate voltage applied to the power transistor device according to at least one signal provided from an external device or fed back from the power transistor device wherein the gate voltage is greater or lower than a threshold voltage of the power transistor device, and a swing amplitude of the gate voltage is a monotonically increasing or decreasing function of the signal.

Yet another aspect of the present disclosure provides a power transistor module, wherein the power transistor module includes a power transistor device and a control circuit. The control circuit is electrically connected to the power transistor device for providing at least one gate voltage to drive the power transistor device, and adjusting the at least one gate voltage in response to an output power of the power transistor module. When the output power is greater than a predetermined power load, the at least one gate voltage has a first swing amplitude; and when the output power is less than or equal to the predetermined power load the at least one gate voltage has a second swing amplitude less than the first swing amplitude.

Further another aspect of the present disclosure provides a controlling method of a power transistor module, wherein the power transistor module includes a power transistor device, and the controlling method includes steps as follows: First, a control circuit electrically connected to the power transistor device is provided. Then, the control circuit is to adjust at least one gate voltage applied to the power transistor device in response to an output power of the power transistor module, when the output power is greater than a predetermined power load, the at least one gate voltage has a first swing amplitude; and when the output power is less than or equal to the predetermined power load the at least one gate voltage has a second swing amplitude less than the first swing amplitude.

According to aforementioned embodiments of the present disclosure, a power transistor module and a controlling method thereof are provided. In the case of using a power transistor device as a power switch device, a control circuit is used to control the gate voltage applied to the power transistor device to turn it on, wherein the gate voltage applied to the power transistor device through the control circuit is determined by a signal that is inputted into the control circuit, and this signal can be either a signal fed back by the transistor device or a signal provided from an external device. This signal must have at least two or more states. When the signal inputted into the control circuit is state 1, the control circuit applies the first gate voltage to the power transistor device; when the signal inputted into the control circuit is state two, the control circuit applies the second gate voltage to the power transistor device; and the first gate voltage and the second gate voltage are greater or lower than the threshold voltage (Vt) of the power transistor device.

Based on the above description, in one embodiment of the present disclosure, when the output power of the power transistor module is high, a higher gate voltage can be applied to the power transistor device to reduce the on-resistance ($R_{ds,on}$) of the power transistor device, whereby the conduction loss of the power transistor device can be reduced, and the efficiency of the power transistor module can be improved. Alternatively, when the output power of the power transistor module is low, a lower gate voltage can be applied to the power transistor device to reduce the electric field applied to the gate insulating layer of the power transistor device, whereby the lifetime of the power transistor device can be increased, and the power consumption required for driving the power transistor device can be reduced.

BRIEF DESCRIPTION OF THE DRAWINGS

The above and other aspects of the disclosure will become better understood with regard to the following detailed description of the preferred but non-limiting embodiment (s). The following description is made with reference to the accompanying drawings

DETAILED DESCRIPTION

The embodiments of the present disclosure provide a power transistor module and a controlling method thereof to reduce the conduction loss and switching loss of the power transistor device built in the power transistor module and extend its lifetime. The present disclosure will now be described more specifically with reference to the following embodiments illustrating the structure and arrangements thereof.

It should be noted that these embodiments are illustrative and for explanatory purposes only, not for limiting the scope of protection of the invention. The invention can be implemented by using other features, elements, methods and parameters. The preferred embodiments are merely for illustrating the technical features of the disclosure, not for limiting the scope of protection. Anyone skilled in the technology field of the disclosure will be able to make suitable modifications or changes based on the specification disclosed below without breaching the spirit of the disclosure. Designations common to the accompanying drawings are used to indicate identical or similar elements.

Figure 1A:
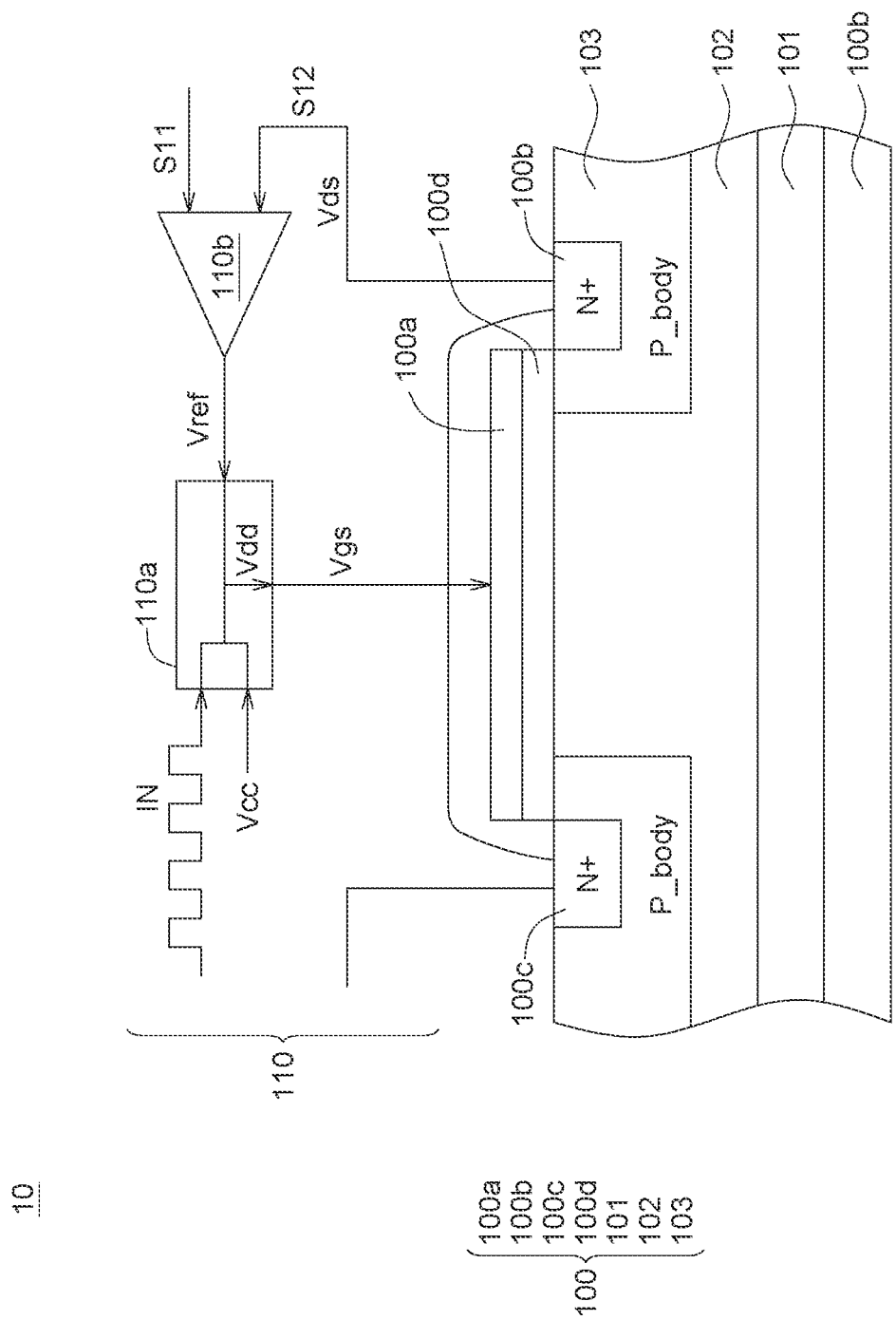
FIG. 1A is a system block diagram illustrating a power transistor module according to one embodiment of the present disclosure.

FIG. 1A is a system block diagram illustrating a power transistor module 10 according to one embodiment of the present disclosure. The power transistor module 10 includes: a power transistor device 100 and a control circuit 110 electrically connected to the power transistor device 100. In some embodiments of the present disclosure, the power transistor device 100 may be a MOSFET device, preferably a SiC MOSFET device.

For example, in the present embodiment, the power transistor device 100 may be a vertical n-channel power MOSFET device. The power transistor device 100 may include an n-type heavily doped substrate 101, a drain 100b formed on the bottom of the substrate 101, an n-type lightly doped epitaxial layer 102 formed on the substrate 101, a gate dielectric layer 100d formed on the epitaxial layer 102, a gate electrode 100a formed on the gate dielectric layer 100d, a p-type doped region (referred as to a P_body) 103 formed in the epitaxial layer 102, an n-type (N+) doped region that is formed in the p-type doped region 103 and adjacent to the gate dielectric layer 100d serving as a source 100c. The material of the substrate 101 can be, for example, SiC; and the crystal form of the SiC can be, for example, 4H, 6H, or 3C.

The material constituting the gate electrode 100a can be, for example, an n-type polysilicon (poly-Si) doped with a high concentration of phosphorus or a p-type polysilicon doped with a high concentration of boron. In addition, the structure of the power transistor device 100 is not limited in this regard. Any type of transistor device that can be used in a power conversion system does not depart from the spirit of the power transistor device 100 described in the present disclosure. For example, in another embodiment of present disclosure, the power transistor may be an enhancement mode (normally-off) SiC MOSFET or a depletion mode (normally-on) SiC MOSFET; in yet another embodiment of present disclosure, the power transistor device may be an IGBT device, preferably a SiC IGBT device.

For example, in another embodiment of this specification, the power transistor device 100 may be a lateral SiC power MOSFET device or a lateral SiC IGBT (not shown) device. In another embodiment of this specification, the power transistor device 100 can also be a wide band-gap power transistor device, wherein the so called wide band gap refers to semiconductor materials with band-gap greater than 2.5 eV, including but not limited to SiC, gallium nitride (GaN), gallium oxide ($Ga_2O_3$), aluminum nitride (AlN), alumina ($Al_2O_3$), diamond and/or other materials used to make MOSFETs, IGBTs, JFETs HEMTs or HFETs or MODFETs.

The control circuit 110 is electrically connected to the power transistor device 100, and can control the gate voltage applied to the gate electrode 100a according to the output power of the power transistor device 100. For example, in some embodiments of the present embodiment, the control circuit 101 includes: a gate driver unit 110a and a voltage regulating unit 110b. The gate driver unit 110a is electrically connected to the power transistor device 100 and is used to output at least one gate voltage Vgs to drive the power transistor device 100. The voltage regulating unit 110b is electrically connected to the gate driver unit 110a and the power transistor device 100, and can provide a reference voltage Vref to the gate driver unit 110a according to a signal S11 provided by an external device (not shown) or a signal S12 fed back from the power transistor device 100. The gate driver unit 110a can adjust the level of the gate voltage Vgs output to the power transistor device 100 in response to the reference voltage Vref.

In one embodiment of the present disclosure, the signal S11 provided by the external device (not shown) may include (but not limited to) a level of power loading, a level of bus-voltage or a combination of these two provided by an external control terminal. The signal S12 fed back from the power transistor device 100 may include a drain current Id and a drain-to-source voltage Vds provided by the drain 100b of the power transistor device 100.

In detail, the control circuit 110 provides the gate driver unit 110a a gate control signal IN to define the states of turn-on and turn-off, a duty-cycle, and a switching frequency of the power transistor device 100. The gate driver unit 110a, for example, further includes a gate driver input stage, a gate driver voltage supply Vdd and a gate driver output buffer, wherein the gate driver voltage supply Vdd is generated based on an external voltage source Vcc and the reference voltage Vref and used to determine the range of the outputted gate voltage Vgs.

In the initial stage, after providing the external voltage source Vcc to turn on the gate driver unit 110a, the gate driver unit 110a provides the gate voltage Vgs according to the gate control signal IN and the gate driver voltage supply Vdd to drive the power transistor device 100. Subsequently, the level of the gate voltage Vgs outputted by the gate driver unit 110a can be adjusted in response to the reference voltage Vref for driving the power transistor device 100. In some embodiments, during the start-up stage, the gate voltage Vgs that is provided from the gate driver unit 110a to turn on the power transistor device 100 can be preferably maintained at a lower quasi-on level to prevent the gate dielectric layer 100d from being damaged by the transient overshoot of the gate voltage generated as the gate driver unit 110a is turned on. At the same time, the driving loss generated by the gate driver unit 110a as driving the power transistor device 100 can be also reduced, because the driving loss Edr (Edr=0.5×Ciss×Vgs2) is proportional to the square of the gate voltage Vgs (wherein Ciss is the input capacitance of the power transistor device 100).

In some embodiments of the present disclosure, the power transistor module 10 has a rated power, which refers to the output power of the power transistor module 10 under a full load. The rated power of the power transistor module 10 may correspond to a drain current, for example, and the drain current may be an RMS current, an average current, or a peak current. The output power of the power transistor module 10 can be determined by referencing the signal S12 (for example, the drain current Id, the drain-to-source voltage Vds, the time delay during switching or the temperature) fed back by the power transistor device 100. The voltage regulating unit 110b can perform calculations based on the signal S12 (for example, the drain current Id, the drain-to-source voltage Vds, the time delay during switching or the temperature) fed back by the power transistor device 100 to determine the output power of the power transistor module 10, or can output the reference voltage Vref to the gate driver unit 110a according to the external signal S11 related to the power loading.

Figure 1B:
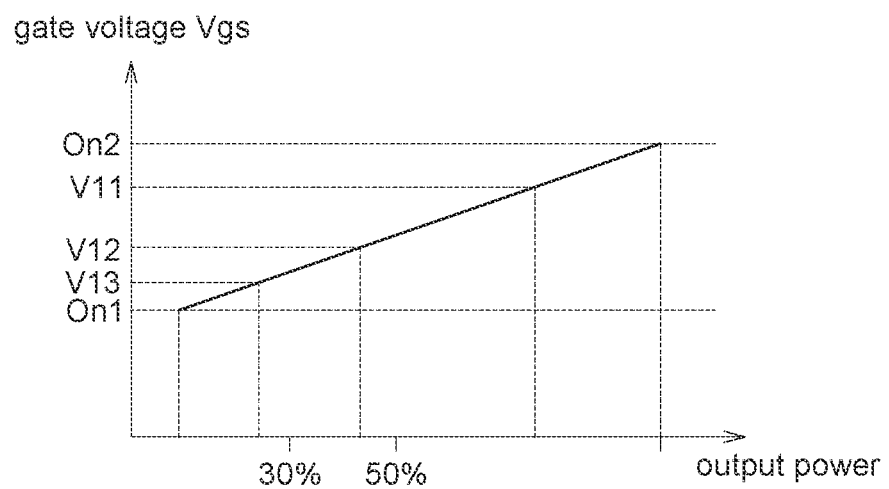
FIG. 1B is a function diagram illustrating the relationship between the gate voltage level (swing amplitude) of the power transistor device as depicted in FIG. 1A and the output power of the power transistor module according to one embodiment of the present disclosure.

For example, the control circuit 110 of the power transistor module 10 includes an algorithm. The swing amplitude of the gate voltage Vgs is a monotonically increasing or monotonically decreasing function of the signal S12 (for example, the drain current Id, the drain-to-source voltage Vds, the time delay during switching or the temperature) fed back from the power transistor device 100. FIG. 1B is a function diagram illustrating the relationship between the gate voltage Vgs level (swing amplitude) of the power transistor device 100 as depicted in FIG. 1A and the output power of the power transistor module 10 according to one embodiment of the present disclosure. As shown in FIG. 1B, the gate voltage Vgs used to turn on the power transistor device 100 increases as the output power of the power transistor module 10 increases, wherein the gate voltage Vgs is increased from the lower gate voltage $V_{gs,on1}$ at light load of the power transistor module 10 to the maximum rated gate voltage $V_{gs,on2}$ at full load. The relationship between the gate voltage Vgs and the output power of the power transistor module 10 is a monotonically increasing function or a monotonically decreasing function, and the range (swing amplitude) of the gate voltage Vgs ranges from on1 to on2. Since the signal S12 (the drain-to-source voltage Vds or the drain current Id) fed back from the power transistor device 100 and the output power of the power transistor module 10 have a positive proportional relationship. Thus, the gate voltage Vgs can be a monotonically increasing or monotonically decreasing function of the signal S12 (the drain current Id, the drain-to-source voltage Vds, the time delay during switching or the temperature) fed back from the power transistor device 100, as shown in FIG. 1B.

In the present embodiment, the function curve of the gate voltage Vgs level (swing amplitude) and the output power (or the drain current Id, the drain-to-source voltage Vds, or time delay during switching, etc.), in FIG. 1B, is continuous. When the output power of the power transistor module 10 is greater than a first ratio (for example, 50%) of the rated power K11, the gate driver unit 110a of the control circuit 110 provides a first gate voltage V11 to drive the power transistor device 100; when the output power of the power transistor module 10 is less than or equal to the first ratio (i.e. 50%) of the rated power K11 and greater than a second ratio (for example, 30%) of the rated power K11, the gate driver unit 110a of the control circuit 110 provides a second gate voltage V12 to drive the power transistor device 100, when the output power of the power transistor module 10 is less than or equal to the second ratio (i.e. 30%) of the rated power K11, the gate driver unit 110a of the control circuit 110 provides a third gate voltage V13 to drive the power transistor device 100; wherein the first gate voltage V11 is greater than the second gate voltage V12, and the second gate voltage V12 is greater than the third gate voltage. Voltage V13.

Figure 2A:
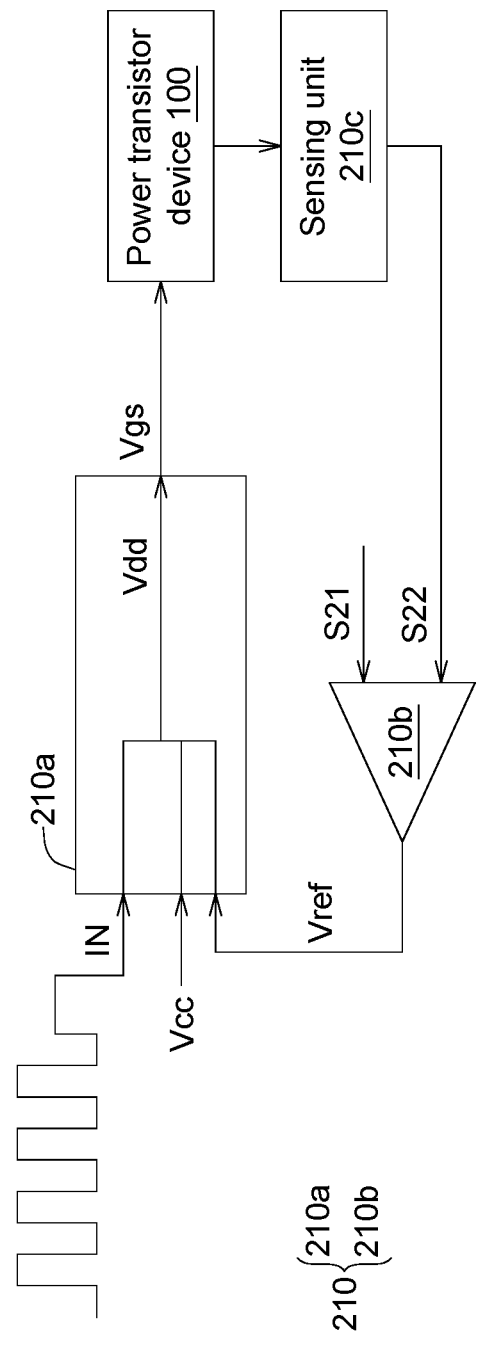
FIG. 2A is a system block diagram illustrating a power transistor module according to another embodiment of the present disclosure.

FIG. 2A is a system block diagram illustrating a power transistor module 20 according to another embodiment of the present disclosure. The system of the power transistor module 20 is substantially similar to that of the power transistor module 10. The difference there between is that the control circuit 210 of the power transistor module 20 further includes a sensing unit 210c. In the present embodiment, the sensing unit 210c is electrically connected to the power transistor device 100 and the voltage regulating unit 210b of the control circuit 210 for sensing at least one signal S22 fed back from the power transistor device 100.

When the power transistor device 100 driven by the gate drive unit 210a is turn on, the drain current can quickly feedback a signal S22 to the voltage regulating unit 210b; and the voltage regulating unit 210b then provides a reference voltage Vref obtained through an algorithm to the gate driving unit 210a, to form a source Vdd voltage that can determine the swing amplitude of the gate voltage; by which the level of the gate voltage Vgs provided to the power transistor device 100 can be further adjusted.

The algorithm of the control circuit 210 of the power transistor module 20 can determine the output power by referencing a signal S21 provided by an external device (not shown) or a signal S22 (such as the drain-to-source voltage Vds or drain current Id) fed back from the power transistor device 100 and a gate control signal IN. When the output power of the power transistor module 20 is greater than a predetermined ratio of its rated output power, the gate driver unit 210a of the control circuit 210 can provide a first gate voltage V21 to drive the power transistor device 100; When the output power of the group 20 is less than or equal to the predetermined ratio of the rated output power, the gate driver unit 210a of the control circuit 210 can provide a second gate voltage V22 to drive the power transistor device 100, wherein the first gate voltage V21 is greater than the second gate voltage V22.

Figure 2B:
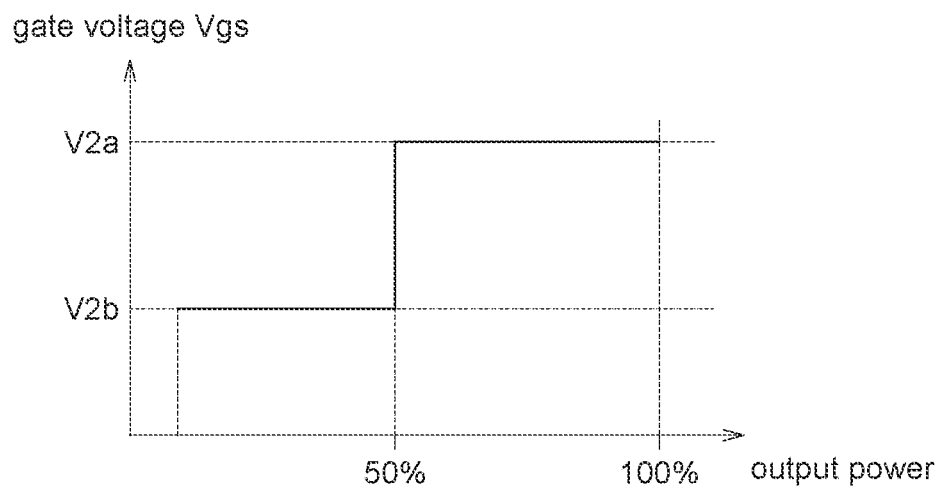
FIG. 2B is a function diagram illustrating the relationship between the gate voltage level (swing amplitude) of the power transistor device as depicted in FIG. 2A and the output power of the power transistor module according to another embodiment of the present disclosure.

FIG. 2B is a function diagram illustrating the relationship between the gate voltage Vgs level (swing amplitude) of the power transistor device 100 as depicted in FIG. 2A and the output power of the power transistor module 20 (the signal S22 fed back from the power transistor device 100) according to another embodiment of the present disclosure. As shown in FIG. 2B, when the output power of the power transistor module 20 is less than a first ratio (for example, 50%) of the rated power, the gate voltage gate provided by the driver unit 210a of the control circuit 210 can be maintained at a first gate voltage V2a. When the output power of the power transistor module 20 is greater than the first ratio (ie. 50%) of the rated power, the gate voltage provided by the gate driver unit 210a of the control circuit 210 can be maintained at a second gate voltage V2b. The gate voltage Vgs level (swing amplitude) is a monotonically increasing or monotonically decreasing function of the output power of the power transistor module 20, and the function curve is discontinuous.

Figure 2C:
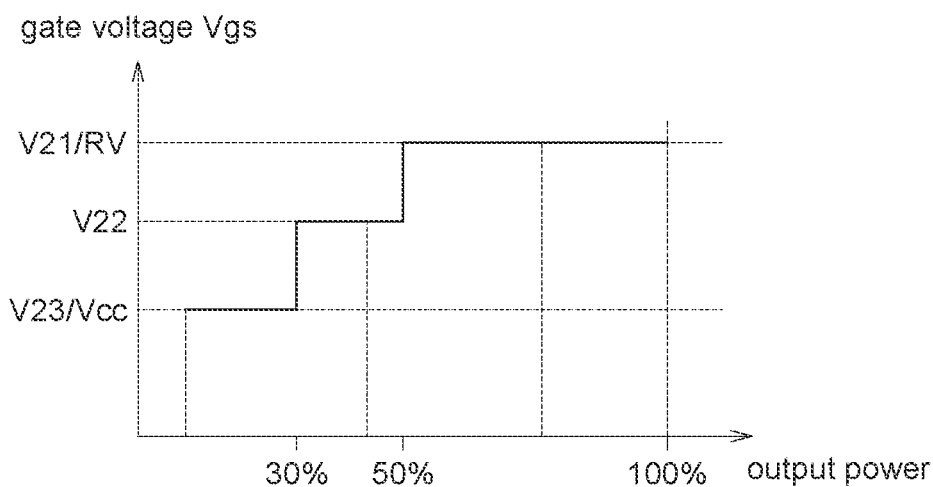
FIG. 2C is a function diagram illustrating the relationship between the gate voltage level (swing amplitude) of the power transistor device as depicted in FIG. 2A and the output power of the power transistor module according to yet another embodiment of the present disclosure.

The function curve between the gate voltage Vgs level (swing amplitude) and the output power of the power transistor module 20 may be a multi-stage discontinuous curve. For example, FIG. 2C is a function diagram illustrating the relationship between the gate voltage Vgs level (swing amplitude) of the power transistor device 100 as depicted in FIG. 2A and the output power of the power transistor module 20 according to yet another embodiment of the present disclosure. In the present embodiment, the algorithm of the control circuit 210 of the power transistor module 20 can determine the output power of the gate driver unit 210a of the power transistor module 10 by referencing a signal S21 provided by an external device (not shown) or a signal S22 (the drain-to-source voltage Vds or the drain current Id) fed back from the power transistor device 100 in combination with a gate control signal IN.

When the output power of the power transistor module 20 is greater than a first ratio (for example, 50%) of the rated power, the gate driver unit 210a of the control circuit 210 provides a first gate voltage V21 (for example, the rated voltage RV) to drive the power transistor device 100. When the output power of the power transistor module 20 is less than or equal to the first ratio (i.e. 50%) of the rated power and greater than a second ratio (for example, 30%) of the rated power, the gate driver unit 210a of the control circuit 210 provides a second gate voltage V22 to drive the power transistor device 100. When the output power of the power transistor module 20 is less than or equal to the second ratio (i.e. 30%) of the rated power, the gate driver unit 210a of the control circuit 210 provides a third gate voltage V23 (for example, the initial voltage Vcc) to drive the power transistor device 100. Wherein the first gate voltage V21 is greater than the second gate voltage V22, and the second gate voltage V22 is greater than the third gate voltage V23.

Figure 3A:
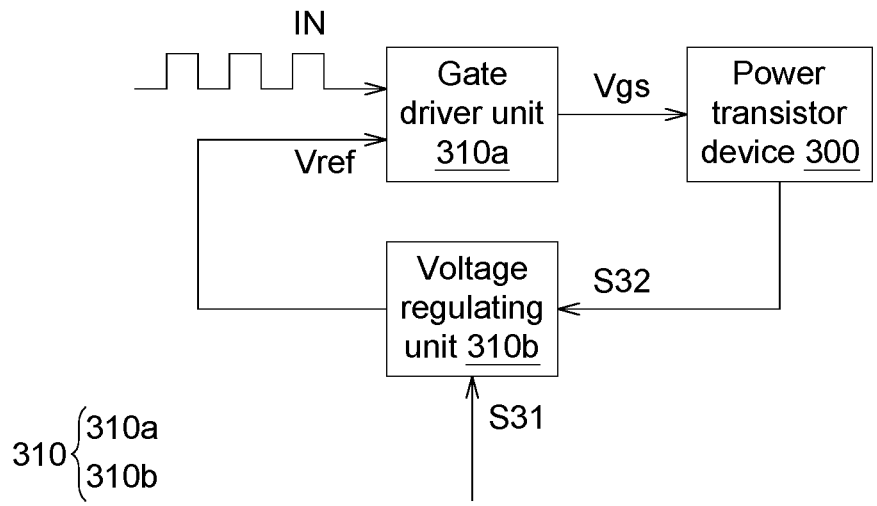
FIG. 3A is a system block diagram illustrating a power transistor module according to a further embodiment of the present disclosure.

FIG. 3A is a system block diagram illustrating a power transistor module 30 according to a further embodiment of the present disclosure. The power transistor module 30 includes at least one power transistor device 300 and a control circuit 301 electrically connected to the power transistor device 300. The control circuit 301 includes: a gate driver unit 310a and a voltage regulating unit 310b. The gate driver unit 310a is electrically connected to the power transistor device 300, and is used to provide at least one gate voltage Vgs to drive the power transistor device 300. The voltage regulating unit 310b is electrically connected to the gate driver unit 310a and the power transistor device 300, and can provide a reference voltage Vref either according to a signal S31 provided by an external device (not shown) and a gate control signal IN, or according to a signal S32 fed back from the power transistor device 300 to adjust the level of the gate voltage Vgs applied to the power transistor device 300.

Figure 3B:
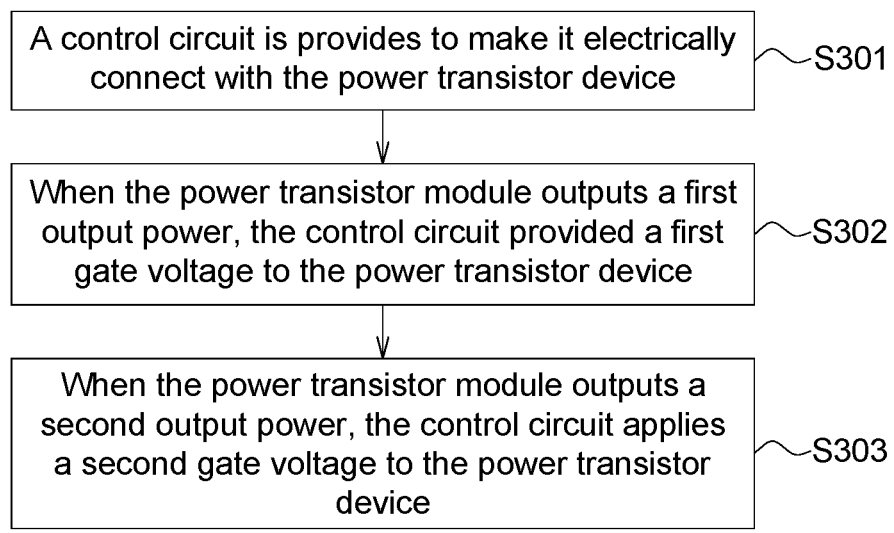
FIG. 3B is a diagram illustrating the controlling method of the power transistor module as depicted in FIG. 3A.

FIG. 3B is a diagram illustrating the controlling method of the power transistor module 30 as depicted in FIG. 3A. The controlling method includes the following steps: Firstly, a control circuit 310 is provided to make it electrically connect with the power transistor device 300 (refer to step S301).

Next, when the power transistor module 30 outputs a first output power, the control circuit 310 provides a first gate voltage to the power transistor device (refer to step S302). When the power transistor module 30 outputs a second output power, the control circuit 310 applies a second gate voltage to the power transistor device (refer to step S303). The first gate voltage and the second gate voltage are greater or lower than the threshold voltage Vth of the power transistor device 300.

A number of embodiments are provided to illustrate the technical characteristics and advantages of the power transistor module 10 (20) as follows:

For example, in some embodiments of the present disclosure, the power transistor device 100 is a SiC MOSFET device with a rated blocking voltage (BVdss) of 1200 volts (V), and its threshold voltage (Vth) is, for example, 2.5V. When the gate voltage provided by the control circuit is 20V, its on-resistance (the drain-to-source on-resistance, Rdson) is 80 milliohms (mΩ), and its on-resistance becomes 100 mΩ when the gate voltage provided by the control circuit is 18V. The rated power of the power transistor module composed of the power transistor device and its control circuit is, for example, 16 kilowatts (KW), the DC output drain-to-source voltage (Vds) is 800V, and the average drain current (Id) under full load is 20 amperes (A). At full load, if the gate voltage is 20V, its conduction loss $P(Vgs=20V)=Id^2 \times R_{dson}=400\times0.08=32(watts)W$. If the gate voltage is 18V, its conduction loss $P(Vgs=18\ V)=Id^2 \times R_{dson}=400\times0.1=40\ W$, increases by 8 W compared to that with Vgs=20V. So by using Vgs=20V, a lower conduction loss at full load can be obtained and the efficiency can be improved. However, with Vgs=20V, the intrinsic lifetime (TDDB lifetime, refer to the time dependent dielectric breakdown) of the gate oxide layer may be reduced, for example, from 5E7 hours of Vgs=18V to 1E7 hours.

At medium load (50% of rated power), for example, the average current Id is 10 A, the conduction loss is 8 W under Vgs=20V; and the conduction loss is 10 W under Vgs=18V, wherein the difference therebetween is only 2 W. In general, a system does not usually operate at 100% full load condition. For example, considering a simplified system where its mission profile if 10% of time being operated at full load and 90% of time being operated at medium load; if the SiC MOSFET is driven by Vgs=18V at medium load; and is driven by Vgs=20V only at full load, then the average conduction loss can be estimated as 12.2 W (10 W×90%+32 W×10%=12.2 W). Compared to driving the SiC MOSFET at Vgs=20V all the time, where the conduction loss is 10.4 W (8 W×90%+32 W×10%=10.4 W, the difference therebetween is only 0.8 W. However, the average lifetime increases from 1E7 hours to 4.6E7 hours (5E7×90%+1E7× 10%=4.6E7), which significantly improves the lifetime and the reliability of the system.

In another embodiment, the control circuit 110 can adjust the voltage applied to the gate electrode 100a of the power transistor device 100 (e.g. a SiC MOSFET device) according to the change in the output power of the power transistor module 100. For example, when the output power is more than 70% of the rated power, the gate voltage applied to the SiC MOSFET device can be adjusted to 20V by the control circuit 110; when the output power is between 30% and 70% of the rated power, the gate voltage applied to the SiC MOSFET device can be adjusted to 18V; when the output power is below 30%, the gate voltage applied to the SiC MOSFET device can be adjusted to 16V. In yet another embodiment, when the output power is below 10%, for example, the gate voltage applied to the SiC MOSFET device can be adjusted to 10V.

In still another embodiment, the control circuit 110 can adjust the gate voltage according to a ratio of the output power of the power transistor module to the rated power, so as to make the gate voltage varying linearly with the ratio of the output power to the rated power. For example, when a SiC MOSFET device is driven to be turned on, the gate voltage Vgs ranges from 16V to 20V, and varies with the load ratio (Load %). For example, the gate voltage Vgs cab be expressed by the following formula: Vgs=(20−16)×(Load %)+16 (V), where the load ratio (Load %) ranges from 0% to 100%.

Figure 4A:
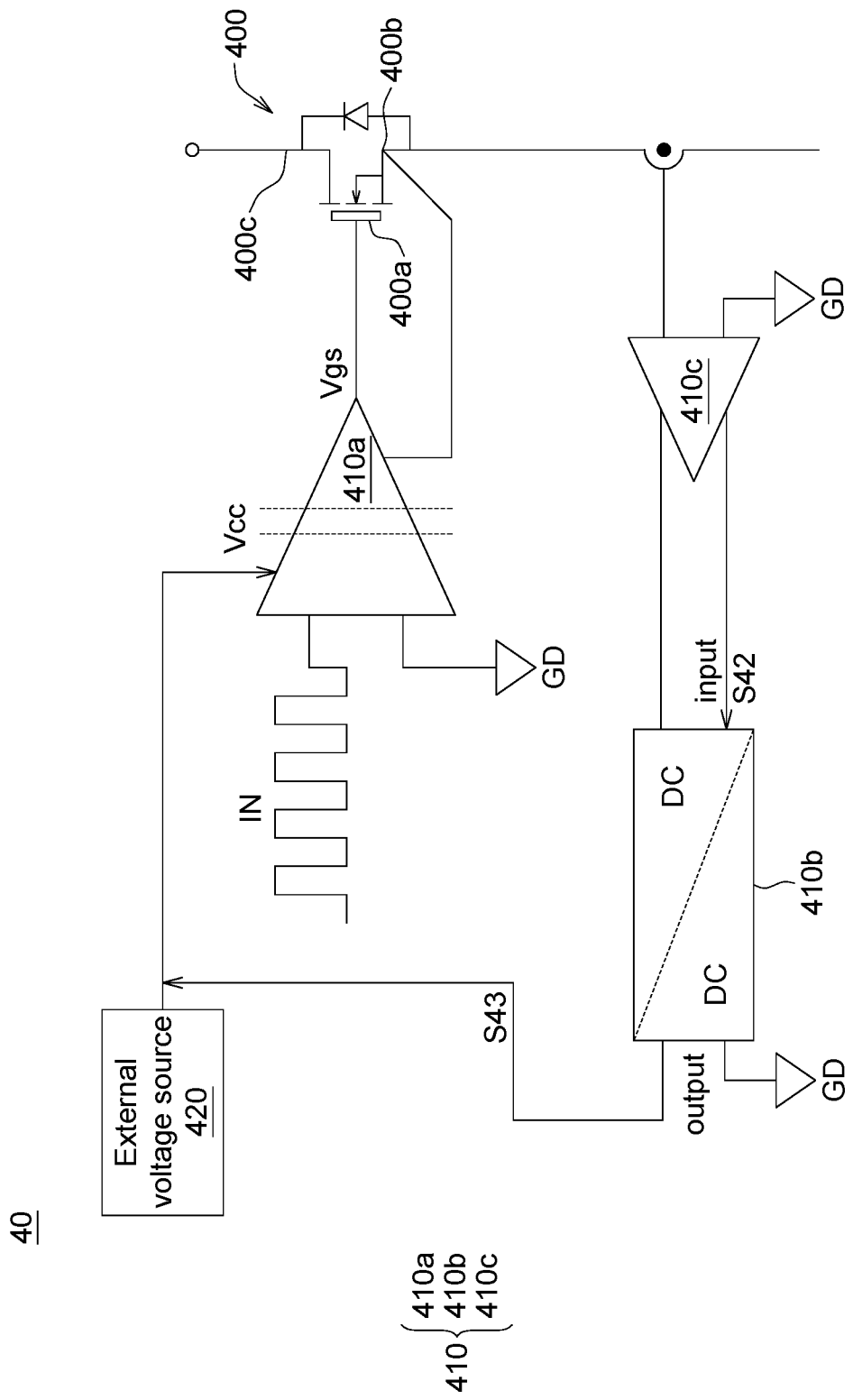
FIG. 4A is a system block diagram illustrating a power transistor module according to a further embodiment of the present disclosure.

FIG. 4A is a system block diagram illustrating a power transistor module 40 according to a further embodiment of the present disclosure. The power transistor module 40 includes at least one power transistor device 400 (e.g. a SiC MOSFET device) and a control circuit 410 electrically connected to the power transistor device 400.

In the present embodiment, the power transistor device 400 is a SiC MOSFET device. The control circuit 410 is electrically connected to the power transistor device 400, and can control the gate voltage Vgs applied to the gate electrode 400*a* according to the output power of the power transistor module 40.

In detail, the control circuit 410 includes: a gate driver unit 410*a*, a voltage regulating unit 410*b* and a sensing unit 410*c*. The gate driver unit 410*a* is electrically connected to the power transistor device 400 and is used to output at least one gate voltage Vgs to drive the power transistor device 400.

The gate driver unit 410*a* includes a gate control signal IN to define the states of turn-on and turn-off, a duty-cycle, and a switching frequency of the power transistor device 400. The voltage regulating unit 410*b* is electrically connected to the gate driver unit 410*a* and the sensing unit 410*c*. The sensing unit 410*c* is electrically connected to the voltage regulating unit 410*b* and the drain 400*b* of the power transistor device 400.

When the power transistor device 400 driven by the gate drive unit 410*a* is turned on by an initial voltage Vcc provided by an external voltage source 420, the drain current Id can quickly feedback a signal to the sensing unit 410*c*, and the drain current Id can be converted to a signal voltage S42 and inputted into the voltage regulating unit 410*b*; and the signal voltage S42 can be amplified by the voltage regulating unit 410*b* to form a compensating voltage S43 that can be added to the initial voltage Vcc to generate the gate voltage Vgs applied to the gate electrode 400*a* of the power transistor device 400. By this approach, the level of the gate voltage Vgs provided to drive the power transistor device 400 can be further adjusted in response to the drain current Id of the power transistor device 400.

In some embodiments of the present disclosure, the sensing unit 410*c* can include (but not limited to) a current-to-voltage converter. The signal voltage S42 provided by the sensing unit 410*c* is proportional to the drain current Id. The voltage regulating unit 410*b* includes at least one DC/DC voltage converter used to proportionally amplify the signal voltage S42 to form the compensating voltage S43, and then is added to the initial voltage Vcc to generate the gate voltage Vgs.

Figure 4B:
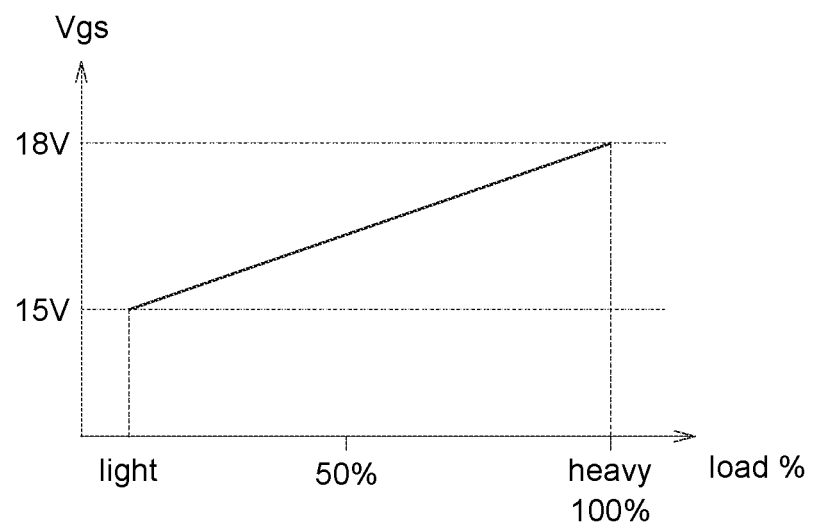
FIG. 4B is a function diagram illustrating the relationship between the gate voltage Vgs level of the power transistor device as depicted in FIG. 4A and the output power of the power transistor module according to one embodiment of the present disclosure.

FIG. 4B is a function diagram illustrating the relationship between the gate voltage Vgs level of the power transistor device 400 as depicted in FIG. 4A and the output power of the power transistor module 40 according to one embodiment of the present disclosure.

In the present embodiment, since the drain current Id of the power transistor device 400 (e.g. a SiC MOSFET device) is proportional to the output power of the power transistor module 40, the signal voltage S42 that is proportional to the drain current Id and the compensating voltage S43 that is proportional to the signal voltage S42 both are proportional to the output power (a collector current) of the power transistor module 40. Such that, when the output power of the power transistor module 40 is increased, the compensating voltage S43 that is proportional to the output power of the power transistor module 40 can further contribute the gate voltage Vgs.

In other words, the gate voltage Vgs that is generated based on the adding of the external voltage source Vcc and the compensating voltage S43 is increased as the output power of the power transistor module 40 is increased. The relationship between the gate voltage Vgs and the output power (the ratio of the rated power) of the power transistor module 40 is a monotonically increasing function.

The control circuit 410 can adjust the voltage applied to the gate electrode 400*a* of the power transistor device 400 according to the change in the output power of the power transistor module 400. For example, in the present embodiment, during the start-up stage, the gate voltage Vgs that is provided from the gate driver unit 410*a* to turn on the power transistor device 400 can be preferably maintained at a lower quasi-on level, such as the initial voltage Vcc (15V). Subsequently, the level of the gate voltage Vgs outputted by the gate driver unit 410*a* can be adjusted in response to the drain current Id for driving the power transistor device 400. When the signal voltage S42 provided by using the sensing unit 410*c* to sense the drain current Id is 1V, the compensating voltage S43 proportionally amplifying the signal voltage S42 is 3V, and the level of the gate voltage Vgs outputted by adding the initial voltage Vcc with the compensating voltage S43 is 18V.

It can be seen that when the power transistor module 40 is operated in a heavy load (for example, the output power is greater than 50% rated power of the power transistor module 40), the gate voltage Vgs provided from the control circuit 410 can be much higher than that when the power transistor module 40 is operated in a light load (for example, the output power is less than 50% rated power of the power transistor module 40).

At the start-up stage, the lower-level gate voltage Vgs (15V) can prevent the gate dielectric layer of the power transistor device 400 from being damaged by the transient overshoot of the gate voltage as it is turned on. The driving loss generated by the gate driver unit 410*a* as driving the power transistor device 400 can be also reduced. At the same time, the total gate charge Qg of the power transistor device 400 and the corresponding driving loss can be reduced by about 12.5%, in comparison to the condition when the start-up gate voltage Vgs is 18V.

When the level of the gate voltage Vgs is increased with increasing output power of the power transistor module 40, a lower conduction loss can be obtained and the efficiency of the power transistor module 40 can be improved at heavy load.

Figure 5A:
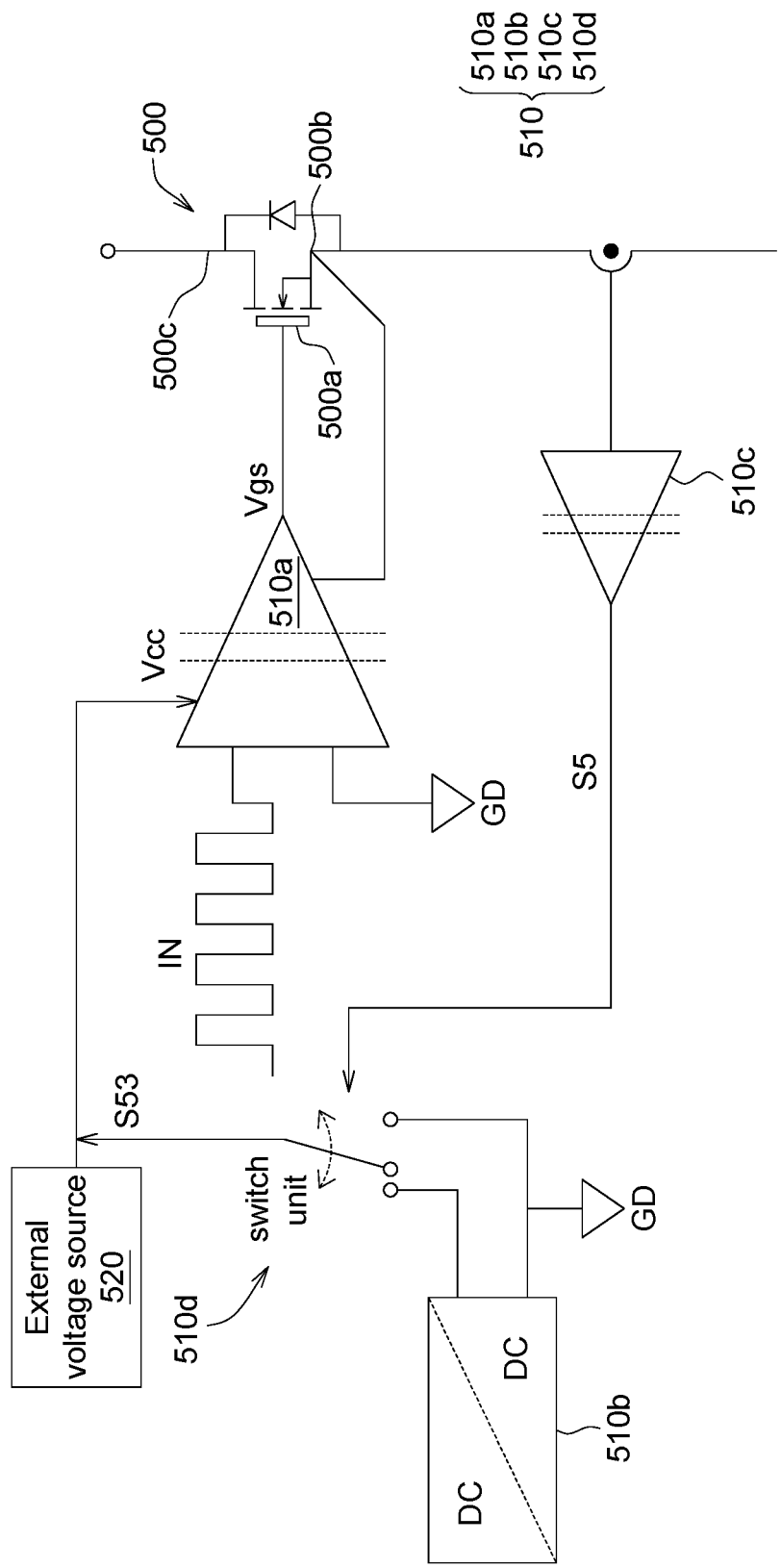
FIG. 5A is a system block diagram illustrating a power transistor module according to a further embodiment of the present disclosure.

FIG. 5A is a system block diagram illustrating a power transistor module 50 according to a further embodiment of the present disclosure. The power transistor module 50 includes at least one power transistor device 500 and a control circuit 510 electrically connected to the power transistor device 500.

In the present embodiment, the power transistor device 500 is a SiC MOSFET device. The control circuit 510 is electrically connected to the power transistor device 500, and can control the gate voltage Vgs applied to the gate electrode 500*a* according to the output power of the power transistor module 50.

In detail, the control circuit 510 includes: a gate driver unit 510*a*, a voltage regulating unit 510*b*, a sensing unit 510*c* and a switch unit 510*d*. The gate driver unit 510*a* is electrically connected to the power transistor device 500 and is used to output at least one gate voltage Vgs to drive the power transistor device 500.

The gate driver unit 510a includes a gate control signal IN to define the states of turn-on and turn-off, a duty-cycle, and a switching frequency of the power transistor device 500. The voltage regulating unit 510b is selectively connected to the gate driver unit 510a through the switch unit 510d. The sensing unit 510c is electrically connected to the switch unit 510d and the drain 500b of the power transistor device 500.

When the power transistor device 500 driven by the gate drive unit 510a is turned on by an initial voltage Vcc (15V) provided by an external voltage source 520, the drain current Id can quickly feedback a signal S52 to the sensing unit 510c to turn on/off the switch unit 510d for selectively connecting the voltage regulating unit 510b with the gate driver unit 510a to provide a compensating voltage S53 (3V) that can be added to the initial voltage Vcc to generate the gate voltage Vgs applied to the gate electrode 500a of the power transistor device 500. By this approach, the level of the gate voltage Vgs provided to drive the power transistor device 500 can be further adjusted in response to the drain current Id of the power transistor device 500.

In some embodiments of the present disclosure, the sensing unit 510c can include (but not limited to) an optocoupler; the switch unit 510d can include (but not limited to) a MOS transistor. The voltage regulating unit 510b includes a power supply used to provide the compensating voltage S53 (3V). When the signal S52 provided by the sensing unit 510c corresponding to (e.g. proportional to) the drain current Id is a voltage greater than the threshold voltage Vth of the MOS transistor, the switch unit 510d can electrically connect the voltage regulating unit 510b with the gate driver unit 510a to allow the compensating voltage S53 (3V) provided by the power supply being added to the initial voltage Vcc to generate the gate voltage Vgs.

Figure 5B:
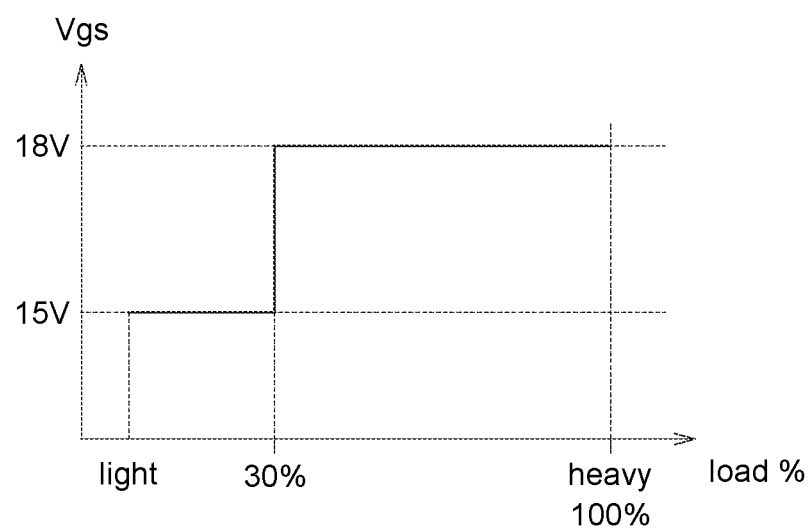
FIG. 5B is a function diagram illustrating the relationship between the gate voltage Vgs level of the power transistor device as depicted in FIG. 5A and the output power of the power transistor module according to one embodiment of the present disclosure.

FIG. 5B is a function diagram illustrating the relationship between the gate voltage Vgs level of the power transistor device 500 as depicted in FIG. 5A and the output power of the power transistor module 50 according to one embodiment of the present disclosure.

In the present embodiment, since the drain current Id of the power transistor device 500 (e.g. a SiC MOSFET device) is proportional to the output power of the power transistor module 50, the signal S52 that is proportional to the drain current Id is also proportional to the output power of the power transistor module 50.

When the output power of the power transistor module 50 is greater than or equal to a ratio (for example, 30%) of the rated power, the sensing unit 510c provides the signal S52 to drive the switch unit 510d electrically connected the voltage regulating unit 510b with the gate driver unit 510a to allow the compensating voltage S53 (3V) provided by the power supply being added to the initial voltage Vcc (15V) to generate the gate voltage Vgs (18V).

When the output power of the power transistor module 50 is less than the ratio (for example, 30% load) of the rated power, the signal voltage S52 provided by the sensing unit 510c cannot turn on the switch unit 510d, the level of the gate voltage Vgs can be maintained as the initial voltage Vcc (15V).

Under a light load (for example, the output power is less than 30% rated power of the power transistor module 50) condition, the lower-level gate voltage Vgs (15V) can prevent the gate dielectric layer of the power transistor device 500 from being damaged by the transient overshoot of the gate voltage as it is turned on. The driving loss generated by the gate driver unit 510a as driving the power transistor device 500 can be also reduced. At the same time, the total gate charge Qg of the power transistor device 500 and the corresponding driving loss can be reduced by about 12.5%, in comparison to the heavy load (for example, greater than 30% load) condition wherein the gate voltage Vgs is 18V.

When power transistor module 50 is operated at a heavy load condition, a lower conduction loss can be obtained and the efficiency of the power transistor module 50 can be improved at heavy load.

Figure 6A:
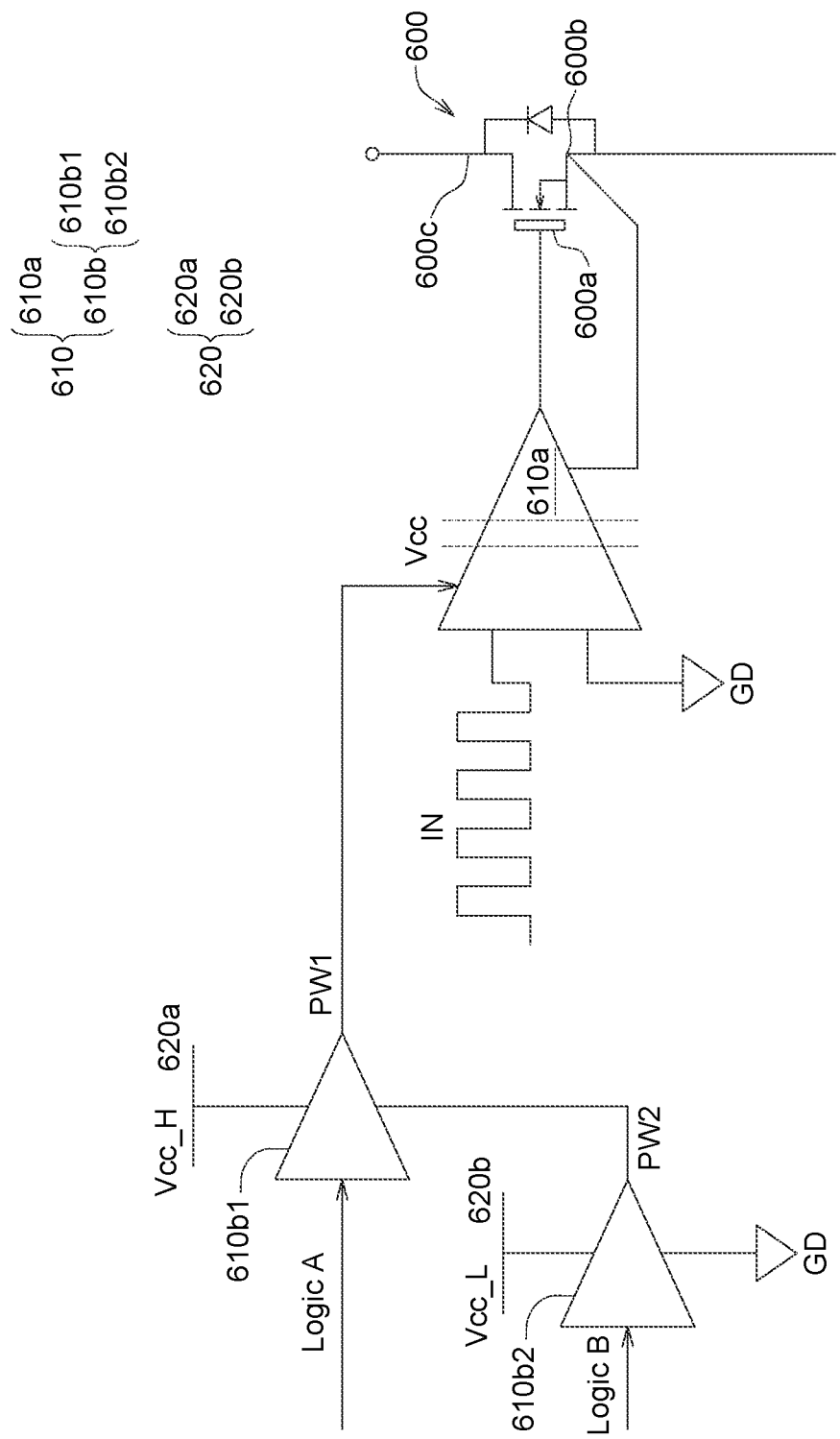
FIG. 6A is a system block diagram illustrating a power transistor module according to a further embodiment of the present disclosure.

FIG. 6A is a system block diagram illustrating a power transistor module 60 according to a further embodiment of the present disclosure. The power transistor module 60 includes at least one power transistor device 600 and a control circuit 610 electrically connected to the power transistor device 600.

In the present embodiment, the power transistor device 600 is a SiC MOSFET device. The control circuit 610 is electrically connected to the power transistor device 600, and can control the gate voltage Vgs applied to the gate electrode 600a according to the output power of the power transistor module 60.

In detail, the control circuit 610 includes: a gate driver unit 610a and a voltage regulating unit 610b. The gate driver unit 610a is electrically connected to the power transistor device 600 and the voltage regulating unit 610b, used to output at least one gate voltage Vgs to drive the power transistor device 600.

The gate driver unit 610a includes a gate control signal IN to define the states of turn-on and turn-off, a duty-cycle, and a switching frequency of the power transistor device 600. The gate driver unit 610a also includes a power input terminal to supply the required power (referred to as the voltage Vcc) to the gate driver unit 610a and simultaneously determine the voltage shifting magnitude of the maximum gate output voltage which is connected to 600a from the minimum source voltage level which is connected to 600b. The voltage regulating unit 610b comprises a first regulator 610b1 and a second regulator 610b2. The first regulator 610b1 provides a first output voltage PW1 as the voltage Vcc of the gate driver unit 610a, according to a first regulating signal Logic A, a high voltage external voltage source Vcc_H as an input. The second regulator 610b2 provides a second output voltage PW2 as the reference voltage of the first regulator 610b1, according to a second regulating signal Logic B, and a low voltage external voltage source Vcc_L as an input and ground GD as the reference. The second regulating signal Logic B regulates the second output voltage PW2 provided by the second regulator 610b2 to be 0V or VCC_L. The first regulating signal Logic A regulates the first output voltage PW1 provided by the first regulator 610b1 to be PW2 or (PW2+Vcc_H).

Figure 6B:
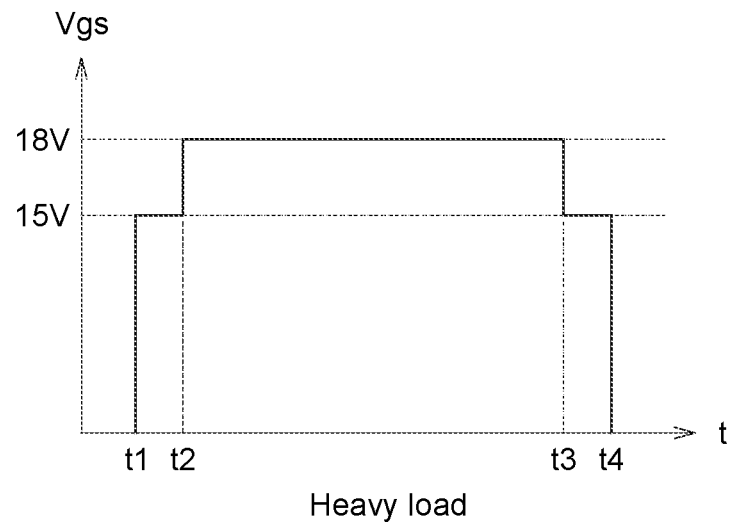
FIG. 6B is a diagram illustrating the waveform of the gate voltage applied to the power transistor device provided by the gate driver unit, in heavy load, according to one embodiment of the present disclosure.

In one embodiment the high voltage external voltage source Vcc_H is 15V and the low voltage external voltage source Vcc_L is 3V. The second regulating signal Logic B regulates the second output voltage PW2 provided by the second regulator 610b2 to be 0V or 3V. The first regulating signal Logic A regulates the first output voltage PW1 provided by the first regulator 610b1 to be 15V (if PW1=PW2+Vcc_H and PW2=0V) or 18V (if PW1=PW2+Vcc_H and PW2=3V). FIG. 6B shows the waveform of the gate voltage Vgs applied to the power transistor device 600 provided by the gate driver unit 610a, in heavy load, where the signal IN in FIG. 6A regulates the output voltage of the gate driver unit 610a to swing between 0V and Vcc. The first output voltage PW1 (as the voltage Vcc) provided by the first regulator 610b1 to the gate driver unit 610a are 15V between t1 and t2, 18V between t2 and t3, and 15V between t3 and t4. When the output power of the power transistor module 60 is in heavy load (for example greater than 50% of rated power), then the duration (t2–t1) and (t4–t3) are shorter than and the duration (t3–t2) is longer than when the output power is in light load (for example, lower than 50% of the rated power).

In other embodiments, the power transistor devices 600 can also be depletion mode (normally-on) transistors. The depletion mode (normally-on) transistors are at on-states with Vgs=0V, and forced to turn off when a negative Vgs is applied, i.e., the threshold voltage of depletion mode (normally-on) transistors are negative. Although the on-resistance (Rdson) of depletion mode (normally-on) transistors, for example, a normally-on SiC JFET, a normally-on SiC MOSFET or a normally-on GaN HEMT, are rated at Vgs=0V, but their Rdson can be further reduced by applying a positive Vgs, for example Vgs=2V. The turn-on switching time and turn-on switching loss is also lower with Vgs=2V compared to Vgs=0V, therefore the efficiency of the power transistor module will be improved if the control circuit provides Vgs=0V in light load and provides Vgs=2V in heavy load to turn on the power transistor device.

In another embodiment, the gate voltage Vgs provided to the power transistor device 600 by the control unit is the gate voltage used to turn off the power transistor 600. And the swing magnitude of the Vgs is larger when the output power is higher. For example, the turn-on gate voltage used to fully turn on an enhancement mode (normally-off) SiC MOSFET is Vgs=15V, and the control circuit provides Vgs=0V to turn off the power transistor device 600 in light load (where Vgs swings 15V, from Vgs=15 to Vgs=0V between on-state and off-state) and provides Vgs=–3V to turn off the power transistor device in heavy load (where Vgs swings 18V, from Vgs=15V to Vgs=–3V between on-state and off-state).

Figure 6C:
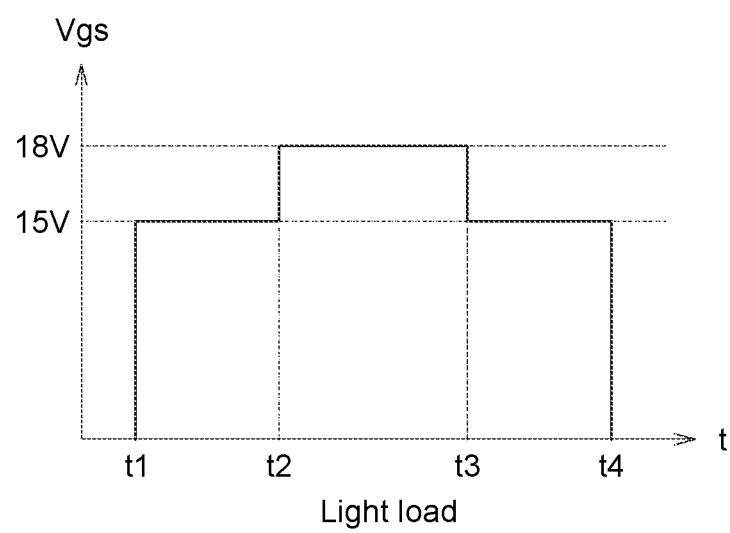
FIG. 6C is a diagram illustrating the waveform of the gate voltage applied to the power transistor device by the control circuit, in light load, according to one embodiment of the present disclosure.

In yet another embodiment, the levels of gate voltage Vgs used to turn on and turn off the power transistor device 600 both depend on the loading of output power. For example, FIG. 6C are the waveforms of the gate voltage Vgs applied to the power transistor device 600 by the control circuit. In light load, the gate voltage Vgs used to turn on and turn off the power transistor device 600 are 15V and 0V, and in heavy load, the gate voltage Vgs used to turn on and turn off the power transistor device are 18V and –3V. The drain current of the power transistor device 600 is lower in light load and higher in heavy load. The conduction loss, the turn-on switching loss Eon and the turn-off switching loss Eoff will be improved with Vgs,on/Vgs,off=18V/–3V compared to with Vgs,on/Vgs,off=15V/0V. Therefore the overall efficiency and lifetime of the power transistor module can be improved.

According to the above embodiments of the present disclosure, a power transistor module and a controlling method are provided to control the gate voltage applied to a power transistor device according to the output power of the power transistor module. When the output power of the power transistor module is high, a higher positive gate voltage can be applied to the power transistor device to reduce the on-resistance ($R_{ds,on}$) and the turn-on switching time of the power transistor device, whereby the conduction loss and the turn-on switching loss of the power transistor device can be reduced and/or a more negative gate voltage can be applied to the power transistor device to reduce the turn-off switching time and the corresponding turn-off switching loss, and the efficiency of the power transistor module can be improved. Alternatively, when the output power of the power transistor module is low, a lower positive gate voltage and/or a less negative gate voltage can be applied to the power transistor device to reduce the electric field applied to the gate insulating layer of the power transistor device, whereby the lifetime of the power transistor device can be increased, and the power consumption required for driving the power transistor device can be reduced.

While the disclosure has been described by way of example and in terms of the preferred embodiment (s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A power transistor module, comprising:
   a power transistor device; and
   a control circuit, electrically connected to the power transistor device, providing at least one gate voltage to drive the power transistor device, and adjusting the at least one gate voltage in response to an output power of the power transistor module; wherein the control circuit comprises:
   a sensing unit, electrically connected to the power transistor device for sensing at least one signal corresponding to the output power;
   a voltage regulating unit, electrically connected to the sensing unit, for providing a compensating voltage according to the at least one signal; and
   a gate driver unit, electrically connected to the power transistor device and the voltage regulating unit, for adjusting a level of the at least one gate voltage by adding the compensating voltage to a previous one of the at least one gate voltage to turn on or turn off the power transistor device;
   wherein when the output power is greater than a predetermined value, the at least one gate voltage has a first amplitude; and when the output power is less than or equal to the predetermined value the at least one gate voltage has a second amplitude less than the first amplitude.

2. The power transistor module according to claim 1, wherein the at least one signal is fed back from the power transistor device and proportional to a drain current or a collector current of the power transistor device.

3. The power transistor module according to claim 1, wherein the voltage regulating unit comprises at least one voltage converter used to proportionally amplify the at least one signal to form the compensating voltage.

4. The power transistor module according to claim 1, wherein the predetermined value is a predetermined ratio of a rated power of the power transistor module.

5. The power transistor module according to claim 1, wherein the control circuit further comprises:
   a switch unit, electrically connected to the sensing unit;
   wherein the voltage regulating unit is selectively connected to the gate driver unit via the switch unit for providing the compensating voltage to turn on or turn off the power transistor device.

6. The power transistor module according to claim 5, wherein the sensing unit comprises an optocoupler; and the switch unit comprises a MOS transistor.

7. The power transistor module according to claim 6, wherein
   when the at least one signal is a voltage greater than a threshold voltage of the MOS transistor, the switch unit electrically connects the voltage regulating unit with the gate driver unit to allow the compensating voltage to be added to or subtracted from a previous one of the at least one gate voltage provided to turn on or turn off the power transistor device; and when the at least one signal is a voltage lower than a threshold voltage of the MOS transistor, the switch unit is turned off.

8. The power transistor module according to claim 6, wherein the voltage regulating unit comprises a power supply used to provide the compensating voltage.

9. The power transistor module according to claim 1, wherein the at least one gate voltage is equal to or higher than zero, the power transistor device turns on when the at least one gate voltage is provided by the control circuit and has a first on-state resistance corresponding to the first amplitude and a second on-state resistance corresponding to the second amplitude; and the first on-state resistance is lower than the second on-state resistance.

10. The power transistor module according to claim 1, wherein the power transistor device driven by the at least one gate voltage has a first switching time corresponding to the first amplitude and a second switching time corresponding to the second amplitude.

11. The power transistor module according to claim 10, wherein the at least one gate voltage is higher than or equal to zero; the first switching time is a time required to turn on the power transistor device with the first amplitude and the second switching time is a time required to turn on the power transistor device with the second amplitude.

12. The power transistor module according to claim 10, wherein the at least one gate voltage is equal to or lower than zero; the first switching time is a time required to turn off the power transistor device with the first amplitude and the second switching time is a time required to turn off the power transistor device with the second amplitude.

13. The power transistor module according to claim 1, wherein the power transistor device is an enhancement mode (normally-off) power transistor or a depletion mode (normally-on) power transistor.

14. The power transistor module according to claim 1, wherein the power transistor device is a wide band-gap power transistor device.

15. The power transistor module according to claim 1, wherein the control circuit provides a gate control signal IN to define states of turn-on and turn-off, a duty-cycle, and a switching frequency of the power transistor device.

16. The power transistor module according to claim 1, wherein the power transistor device comprises a semiconductor material selected from a group consisting of silicon carbide (SiC), gallium nitride (GaN), gallium oxide ($Ga_2O_3$), aluminum nitride (AlN), alumina ($Al_2O_3$), diamond and arbitrary combinations thereof.

17. The power transistor module according to claim 1, wherein the power transistor device is a metal-oxide-semiconductor field effect transistor (MOSFET), an insulated gate bipolar transistor (IGBT), a junction field effect transistor (JFET), a high electron mobility transistor (HEMT), a heterostructure field effect transistor (HFET) or a modulation-doped field effect transistor (MODFET).

18. A power transistor module, comprising:
a power transistor device; and
a control circuit, electrically connected to the power transistor device, providing at least one gate voltage to drive the power transistor device, and adjusting the at least one gate voltage in response to an output power of the power transistor module, wherein when the output power is greater than a predetermined value, the at least one gate voltage has a first amplitude; and when the output power is less than or equal to the predetermined value the at least one gate voltage has a second amplitude less than the first amplitude; wherein the control circuit comprises:
a gate driver unit, electrically connected to the power transistor device; and
a voltage regulating unit, electrically connected to the gate driver unit and comprising:
a first logic, electrically connected to a high voltage external voltage source for providing the gate driver unit a first power in response to the output power of the power transistor module; and
a second logic, electrically connected to a low voltage external voltage source for providing the gate driver unit a second power in response to the output power;
whereby, a level of the at least one gate voltage is adjusted by combining the first power and the second power.

19. The power transistor module according to claim 18, wherein the first logic and the second logic are respectively included in a microcontroller unit (MCU).

20. A controlling method of a power transistor module, wherein the power transistor module comprises a power transistor device, wherein the controlling method comprises:
providing a control circuit electrically connected to the power transistor device; and
using the control circuit to adjust at least one gate voltage applied to the power transistor device in response to an output power of the power transistor module,
wherein the control circuit comprises:
a sensing unit, electrically connected to the power transistor device for sensing at least one signal corresponding to the output power;
a voltage regulating unit, electrically connected to the sensing unit, for providing a compensating voltage according to the at least one signal; and
a gate driver unit, electrically connected to the power transistor device and the voltage regulating unit, for adjusting a level of the at least one gate voltage by adding the compensating voltage to a previous one of the at least one gate voltage to turn on or turn off the power transistor device;
wherein when the output power is greater than a predetermined value, the at least one gate voltage has a first amplitude; and when the output power is less than or equal to the predetermined value the at least one gate voltage has a second amplitude less than the first amplitude.

21. The controlling method according to claim 20, wherein the at least one signal is fed back from the power transistor device and proportional to a drain current or a collector current of the power transistor device.

22. The controlling method according to claim 20, wherein the control circuit further comprises:
a switch unit, electrically connected to the sensing unit;
wherein the voltage regulating unit is selectively connected to the gate driver unit via the switch unit for providing the compensating voltage.

23. A controlling method of a power transistor module, wherein the power transistor module comprises a power transistor device, and wherein the controlling method comprises:
providing a control circuit electrically connected to the power transistor device; and
using the control circuit to adjust at least one gate voltage applied to the power transistor device in response to an output power of the power transistor module, wherein the control circuit comprises:
a gate driver unit, electrically connected to the power transistor device; and
a voltage regulating unit, electrically connected to the gate driver unit and comprising:
a first logic, electrically connected to a high voltage external voltage source for providing the gate driver unit a first power in response to the output power of the power transistor module; and
a second logic, electrically connected to a low voltage external voltage source for providing the gate driver unit a second power in response to the output power;
whereby, a level of the at least one gate voltage is adjusted by combining the first power and the second power.

* * * * *